(12) United States Patent
Chen

(10) Patent No.: US 10,826,503 B1
(45) Date of Patent: Nov. 3, 2020

(54) PHASE-LOCKED LOOP CIRCUIT

(71) Applicant: REALTEK SEMICONDUCTOR CORP., Hsinchu (TW)

(72) Inventor: Chien-Wen Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/795,724

(22) Filed: Feb. 20, 2020

(30) Foreign Application Priority Data

Jun. 13, 2019 (TW) .............................. 108120544 A

(51) Int. Cl.
*H03L 7/087* (2006.01)
*H03L 7/18* (2006.01)
*H03L 7/081* (2006.01)

(52) U.S. Cl.
CPC ............ *H03L 7/087* (2013.01); *H03L 7/0812* (2013.01); *H03L 7/18* (2013.01)

(58) Field of Classification Search
CPC ......... H03L 7/087; H03L 7/0812; H03L 7/18; H03L 7/089; H03L 7/095; H03L 7/0816
See application file for complete search history.

(56) References Cited

U.S. PATENT DOCUMENTS 9,520,889 B2 * 12/2016 Unruh .................... H03L 7/1974
10,651,858 B2 * 5/2020 Ott ....................... H03C 3/0966

OTHER PUBLICATIONS

Dongyi Liao; Fa Foster Dai; Bram Nauta; Eric Klumperink. "Multi-Phase Sub-Sampling Fractional-N PLL with Soft Loop Switching for Fast Robust Locking," 2017 IEEE.
Xiang Gao; Eric A. M. Klumperink; Gerard Socci; Mounir Bohsali; Bram Nauta. "Spur Reduction Techniques for Phase-Locked Loops Exploiting a Sub-Sampling Phase Detector," IEEE Journal of Solid-State Circuits, vol. 45, No. 9, Sep. 2010.

* cited by examiner

*Primary Examiner* — Jung Kim
(74) *Attorney, Agent, or Firm* — Li & Cai Intellectual Property (USA) Office

(57) ABSTRACT

A phase-locked loop circuit includes a delay phase-locked loop and a sub-sampling phase-locked loop. The delay phase-locked loop phase locks a first reference clock and a second reference clock to an input clock, and includes a phase correction circuit, an integrator, a first sub-sampling phase detector, and a first charge pump. The sub-sampling phase-locked loop is configured to generate an output clock with a predetermined phase-locked loop frequency, and the output clock is phase-locked to the first reference clock, the sub-sampling phase-locked loop includes a second sub-sampling phase detector, a second charge pump, a phase frequency detecting circuit, a voltage controlled oscillator and a first frequency divider. The first sub-sampling phase detector and the second sub-sampling phase detector have a symmetric circuit structure, and a first charge pump circuit and a second charge pump circuit have a symmetric circuit structure.

20 Claims, 6 Drawing Sheets

PHASE-LOCKED LOOP CIRCUIT

CROSS-REFERENCE TO RELATED PATENT APPLICATION

This application claims the benefit of priority to Taiwan Patent Application No. 108120544, filed on Jun. 13, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a phase-locked loop circuit, and more particularly to a phase-locked loop circuit with a symmetric circuit architecture.

BACKGROUND OF THE DISCLOSURE

A phase-locked loop (PLL) is a frequency and phase synchronization technique implemented by feedback control principle, which synchronizes a clock signal output from a circuit with an external reference clock signal. When a frequency or a phase of the reference clock changes, the phase-locked loop detects the change and adjusts an output frequency through an internal feedback system until the two are resynchronized. This synchronization is also called being "phase-locked".

In a conventional PLL, since an N-divider is set on a feedback path, noise of a phase detector (PD) and a charge pump (CP) is multiplied by $N^2$ after being output by a voltage-controlled oscillator (VCO). The factor dominates phase noise of the PLL and limits jitter-power factor (FOM) of the PLL. Therefore, a sub-sampling phase-locked loop (SSPLL) has been developed. A phase detector is used in the SSPLL to sub-sample an output of a high frequency VCO with a reference clock. Since the frequency divider is omitted on the feedback path, the noise of the PD and CP in the PLL will not be multiplied by $N^2$ and will be greatly attenuated due to a high phase detection gain, resulting in lower phase noise and better jitter-power factor of the PLL.

However, when the above-mentioned SSPLL is applied to a delay-locked loop achieving lower spur, an output clock must be sampled simultaneously with another sampling circuit, and since the two sampling circuits have different loads relative to the output clock, errors may appear in sampling positions. Therefore, there is a need to improve the circuit design to provide a sub-sampling circuit that accurately samples the output clock to improve circuit performance to overcome the above drawbacks.

SUMMARY OF THE DISCLOSURE

In response to the above-referenced technical inadequacies, the present disclosure provides a phase-locked loop circuit utilizing two sub-sampling phase detectors with a symmetric circuit architecture and a charge pump to achieve symmetric sampling, thereby improving performance.

In one aspect, the present disclosure provides a phase-locked loop circuit that includes a delay phase-locked loop and a sub-sampling phase-locked loop. The delay phase-locked loop phase locks a first reference clock and a second reference clock to an input clock, and includes a phase correction circuit, a first sub-sampling phase detector, and a first charge pump. The phase correction circuit is configured to adjust the input clock according to a first control signal or a second control signal, and generate the first reference clock and the second reference clock. The first sub-sampling phase detector is configured to sample an output clock differential pair with the second reference clock, and convert phase errors between the second reference clock and the output clock differential pair to output a first charge pump control signal pair. The first charge pump circuit is configured to generate the second control signal according to the first charge pump control signal pair. The sub-sampling phase-locked loop is configured to generate the output clock differential pair with a predetermined phase-locked loop frequency, and the output clock is phase-locked to the first reference clock, the sub-sampling phase-locked loop includes a second sub-sampling phase detector, a second charge pump, a phase frequency detecting circuit, a voltage controlled oscillator and a first frequency divider. The first sub-sampling phase detector is configured to sample an output clock differential pair with the second reference clock, and convert a phase error between the second reference clock and the output clock differential pair to output a first charge pump control signal pair. The second charge pump circuit is configured to generate a third control signal according to a second charge pump control signal pair. The phase frequency detecting circuit is configured to receive the first reference clock and a frequency-dividing signal, and when a phase error between the first reference clock and the frequency-dividing signal is greater than a predetermined dead time, the phase detecting circuit generates a fourth control signal. The voltage controlled oscillator is configured to generate the output clock differential pair based on the third control signal and the fourth control signal. The first frequency divider is configured to frequency divide the output clock differential pair to generate the frequency-dividing signal. The first sub-sampling phase detector and the second sub-sampling phase detector have a symmetric circuit structure, and the first charge pump circuit and the second charge pump circuit have a symmetric circuit structure, so that the first sub-sampling phase detector and the second sub-sampling phase detector have same loads when the output clock differential pair is respectively sampled by the first sub-sampling phase detector and the second sub-sampling phase detector.

Therefore, the phase-locked loop circuit provided by the present disclosure utilizes two sub-sampling phase detectors with a symmetric circuit architecture and a charge pump to achieve symmetric sampling, so that waveforms of the output clock differential pair will not be affected when a sub-sampling phase detection technology is applied in the phase-locked loop circuit, and thus accurate sampling can be achieved to improve the performance of the phase-locked loop circuit.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
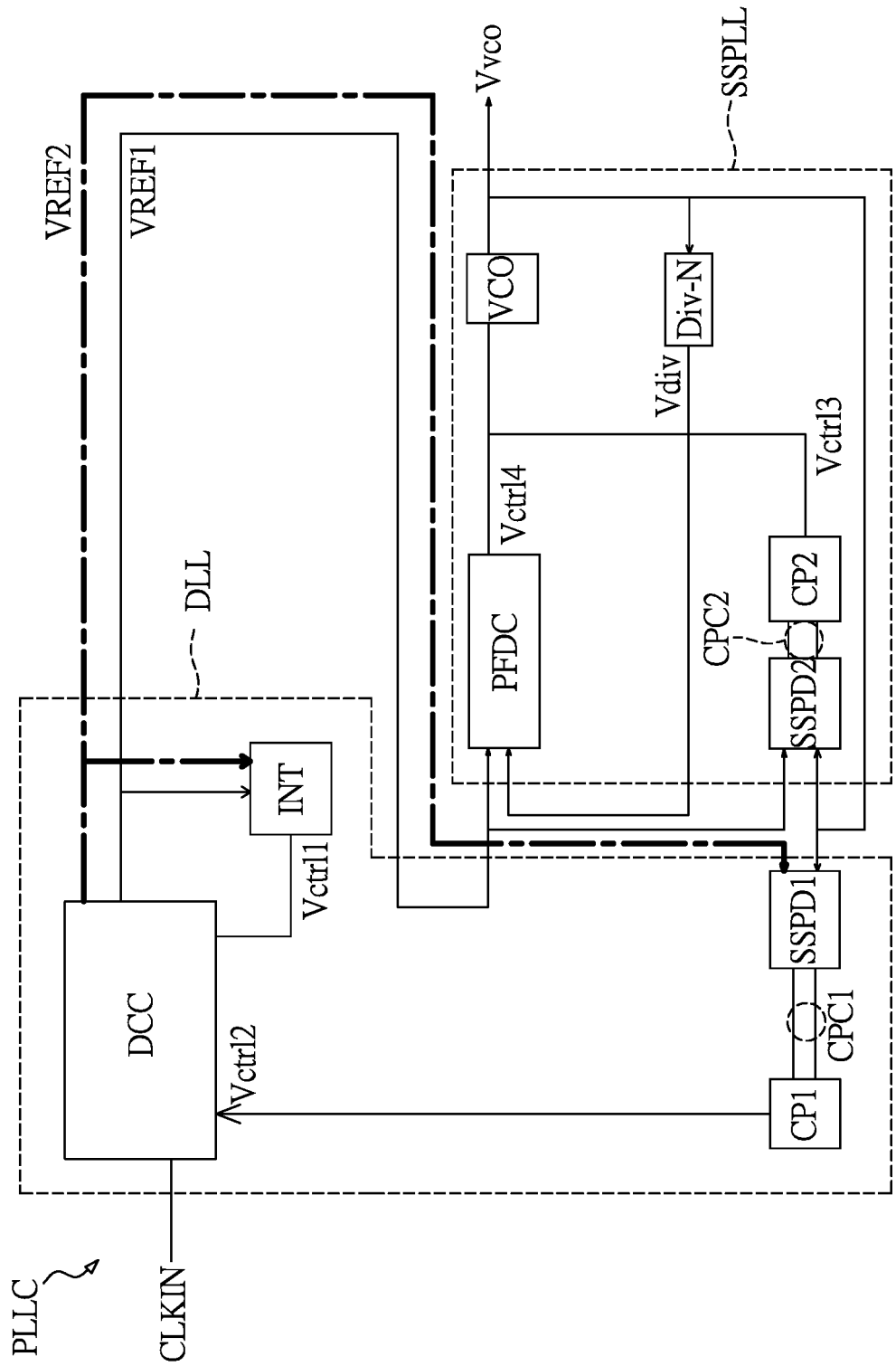
FIG. 1 is a block diagram of a phase-locked loop circuit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a block diagram of a phase-locked loop circuit according to an embodiment of the present disclosure. As shown in FIG. 1, an embodiment of the present disclosure provides a phase-locked loop circuit PLLC including a delay phase-locked loop DLL and a sub-sampling phase-locked loop SSPLL. The delay phase-locked loop DLL synchronizes a first reference clock VREF1 and a second reference clock VREF2 with an external input clock CLKIN by using a feedback control principle. In other words, the first reference clock VREF1 and the second reference clock VREF2 are phase-locked to the input clock CLKIN, thereby achieving frequency and phase synchronization.

As shown in FIG. 1, the delay phase-locked loop DLL includes a phase correction circuit DCC, an integrator INT, a first sub-sampling phase detector SSPD1 and a first charge pump circuit CP1.

The phase correction circuit DCC is configured to adjust the input clock CLKIN according to a first control signal Vctrl1 or a second control signal Vctrl2, and generate the first reference clock VREF1 and the second reference clock VREF2.

The integrator INT is configured to generate the first control signal Vctrl1 according to the first reference clock VREF1 and the second reference clock VREF2, details of which will be described in detail hereinafter.

Figure 2:
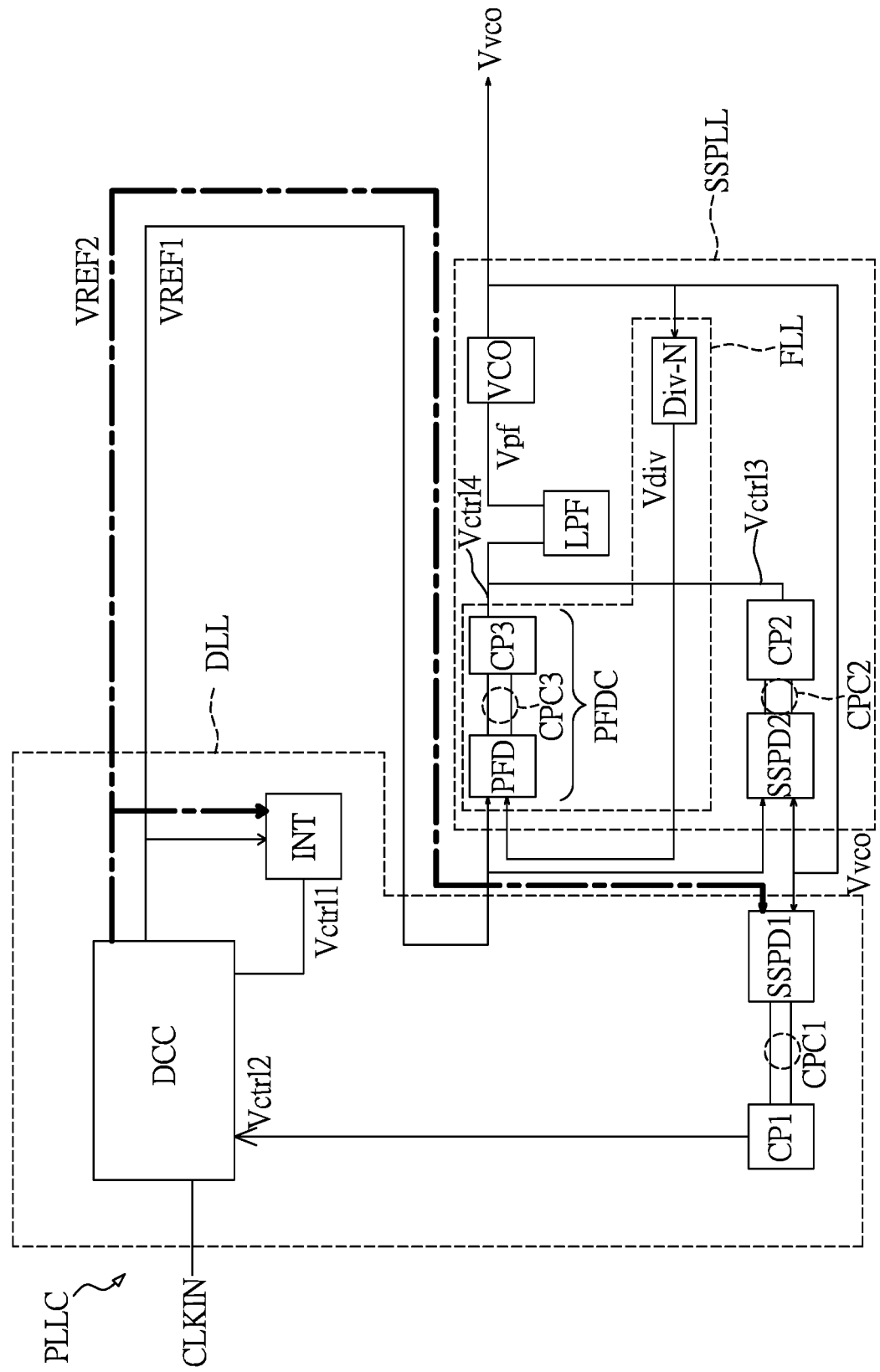
FIG. 2 is a circuit diagram of a delay phase-locked circuit according to an embodiment of the present disclosure.

Further, reference is made to FIG. 2, which is a circuit diagram of a delay phase-locked circuit according to an embodiment of the present disclosure. As shown in FIG. 2, the integrator INT generates the first control signal Vctrl1 according to the first reference clock VREF1 and the second reference clock VREF2. In the present embodiment, the first control signal Vctrl1 may vary with an average component of duty cycles of the first reference clock VREF2 and the second reference clock VREF2.

For example, the integrator INT may decrease (or increase) a voltage level of the first control signal Vctrl1 when the duty cycles of the first reference clock VREF1 and the second reference clock VREF2 are greater than (or less than) a target value (for example, 50%). Alternatively, when duty ratios of the first reference clock VREF1 and the second reference clock VREF2 are greater than (or less than) the target value, the voltage level of the first control signal Vctrl1 is increased (or decreased). The change of the first control signal Vctrl1 reflects the changes of the duty cycles of the first reference clock VREF1 and the second reference clock VREF2. Therefore, the integrator INT can be used as a frequency multiplier in a duty cycle adjustment mode and has a low amount of jitter.

On the other hand, the first sub-sampling phase detector SSPD1 is coupled to the phase correction circuit DCC, and the first charge pump circuit CP1 is coupled to the first sub-sampling phase detector SSPD1. The first sub-sampling phase detector SSPD1 receives the second reference clock VREF2 and an output clock differential pair Vvco for sampling the output clock differential pair Vvco with the second reference clock VREF2, converting phase errors between the second reference clock VREF2 and the output clock differential pair Vvco and outputting a first charge pump control signal pair CPC1. The first charge pump circuit CP1 generates the second control signal Vctrl2 according to the first charge pump control signal pair CPC1.

The control signal generated by the first sub-sampling phase detector/first charge pump SSPD1/CP1 can be filtered by a low-pass filter to generate the second control signal Vctrl2. The purpose of which is to add a sub-sampling delay-locked loop (SSDLL) on the sub-sampling phase-locked loop SSPLL, the SSDLL uses the same sub-sampling phase detecting circuit as the sub-sampling phase-locked loop SSPLL, but a sampling clock used is an inversion of the first reference clock VREF1, that is, the second reference clock VREF2. Therefore, the sub-sampling phase-locked loop SSPLL samples the output clock differential pair Vvco of a voltage controlled oscillator VCO by using rising edges, such that the rising edges of the second reference clock VREF2 (that is, falling edges of the first reference clock VREF1) can be aligned with zero crossing points of the output clock differential pair Vvco. Therefore, in a delay-locked loop mode, the sub-sampling delay-locked loop SSDLL can be used as a phase retarder in the sub-sampling phase-locked loop SSPLL and has a lower spur.

Referring back to FIG. 2, the sub-sampling phase-locked loop SSPLL is used to generate the output clock differential pair Vvco with a predetermined phase-locked loop frequency, and the output clock differential pair Vvco is phase-locked to the first reference clock VREF1. Specifically, the sub-sampling phase-locked loop SSPLL includes a second sub-sampling phase detector SSPD2, a second charge pump circuit CP2, a phase frequency detecting circuit PFDC, the voltage controlled oscillator VCO, and a first frequency divider Div-N.

The second sub-sampling phase detector SSPD2 is configured to sample the output clock differential pair Vvco with the first reference clock VREF1, and convert phase errors between the first reference clock VREF1 and the output clock differential pair Vvco and output a second charge pump control signal pair CPC2. The second charge pump CP2 is configured to generate a third control signal Vctrl3 according to the second charge pump control signal pair CPC2.

The phase frequency detecting circuit PFDC is configured to receive the first reference clock VREF1 and a frequency-dividing signal Vdiv, and when a phase error between the first reference clock VREF1 and the frequency-dividing signal Vdiv is greater than a predetermined dead time, the phase detecting circuit PFDC generates a fourth control signal Vctrl4.

The voltage controlled oscillator VCO generates the output clock differential pair Vvco according to the third control signal Vctrl3 and the fourth control signal Vctrl4. The first frequency divider Div-N is configured to frequency divide the output clock differential pair Vvco to generate the frequency-dividing signal Vdiv.

On the other hand, when the phase errors between the first reference clock VREF1 and the output clock differential pair Vvco output from the voltage controlled oscillator VCO is small, the phase frequency detecting circuit PFDC detects that the phase error is smaller than the predetermined dead time, and thus the output thereof goes to zero. In other words, the voltage controlled oscillator VCO is mainly controlled by the fourth control signal Vctrl4 until the output clock differential pair Vvco is close to being locked, and the third control signal Vctrl3 is used to control the voltage controlled oscillator VCO to be in a locked state when the output clock differential pair Vvco is in a locked state. Therefore, in the locked state, the sub-sampling phase-locked loop SSPLL does not have a frequency divider on a feedback path, thus eliminating the noise generated by the frequency divider and the power thereof. Hence the sub-sampling phase-locked loop SSPLL can achieve very low phase noise.

A phase frequency detector PFD receives the first reference clock VREF1 and the frequency-dividing signal Vdiv. When the phase error between the first reference clock VREF1 and the frequency-dividing signal Vdiv is greater than the predetermined dead time, the phase frequency detector PFD generates a third charge pump control signal pair CPC3. The third charge pump CP3 is configured to generate a fourth control signal Vctrl4 according to the third charge pump control signal pair CPC3.

Furthermore, as shown in FIG. 2, the sub-sampling phase-locked loop SSPLL further includes a low-pass filter LPF for filtering the third control signal Vctrl3 and the fourth control signal Vctrl4 to generate a second filtered signal Vpf, and the voltage controlled oscillator VCO generates the output clock differential pair Vvco according to the second filtered signal Vpf. In this way, the second sub-sampling phase detector SSPD2 and the second charge pump CP2 sample the output clock differential pair Vvco of the voltage controlled oscillator VCO, but cannot distinguish the frequency of the first reference clock VREF1 from other harmonics of the frequency. Therefore, the sub-sampled phase-locked loop SSPLL may be erroneously locked to an unwanted frequency division ratio, thus a frequency-locked loop FLL is needed for accurately locking the frequency. Here, the frequency-locked loop FLL includes the phase frequency detecting circuit PFDC and the first frequency divider Div-N.

It should be noted that the voltage controlled oscillator VCO can be a oscillator (Ring or LC VCO), which has a larger adjustment gain, and therefore, a small variation in the control signal will cause a large variation in the output clock differential pair Vvco output from the voltage controlled oscillator VCO. Therefore, it is necessary to provide a frequency-locked loop FLL with a precisely predetermined dead time for the sub-sampling phase-locked loop SSPLL to operate when the output clock differential pair Vvco is farther away from a frequency-locked state.

Figure 3:
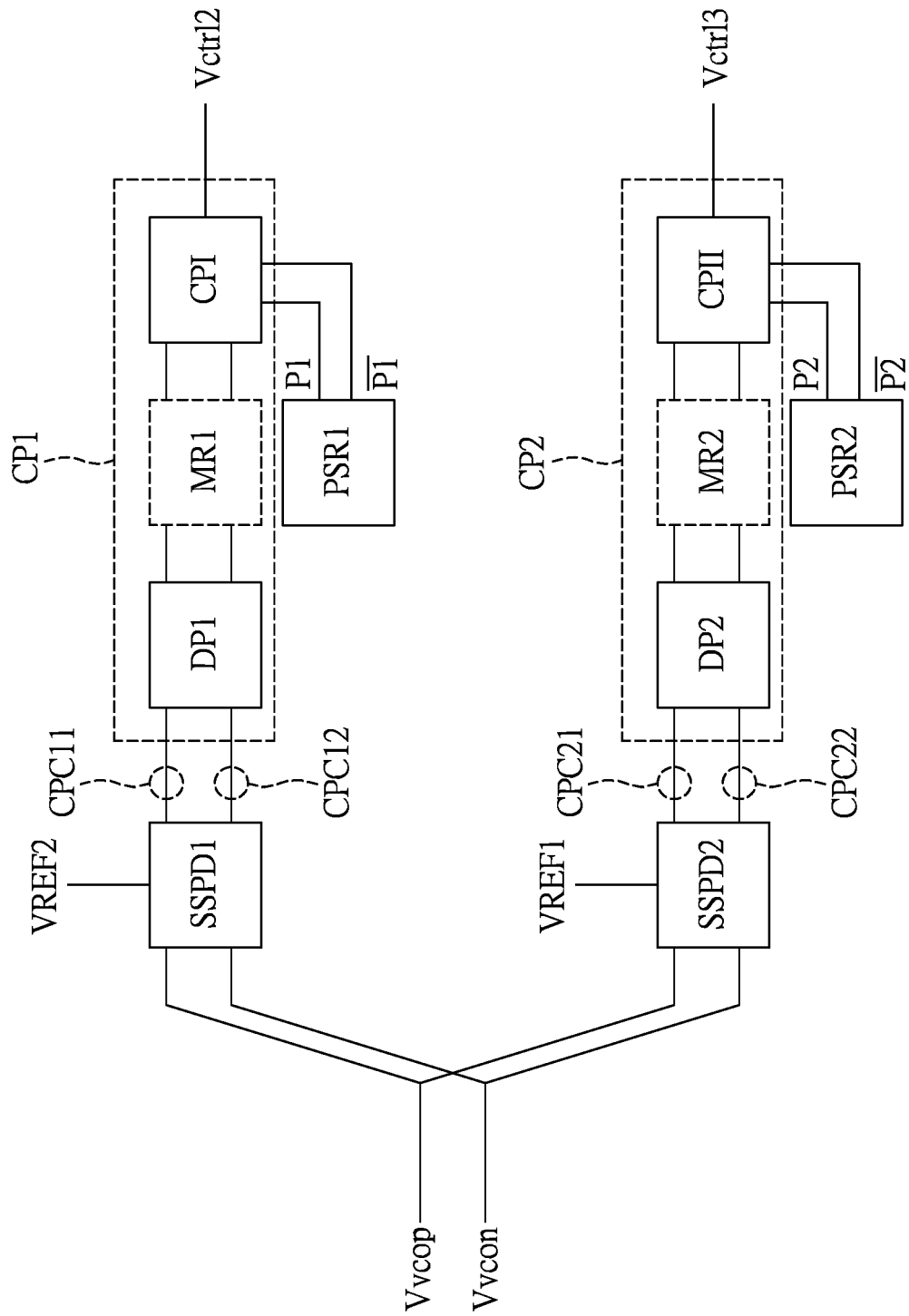
FIG. 3 is a circuit diagram of a first sub-sampling phase detector, a first charge pump circuit, a second sub-sampling phase detector, and a second charge pump circuit according to an embodiment of the present disclosure.
Figure 4:
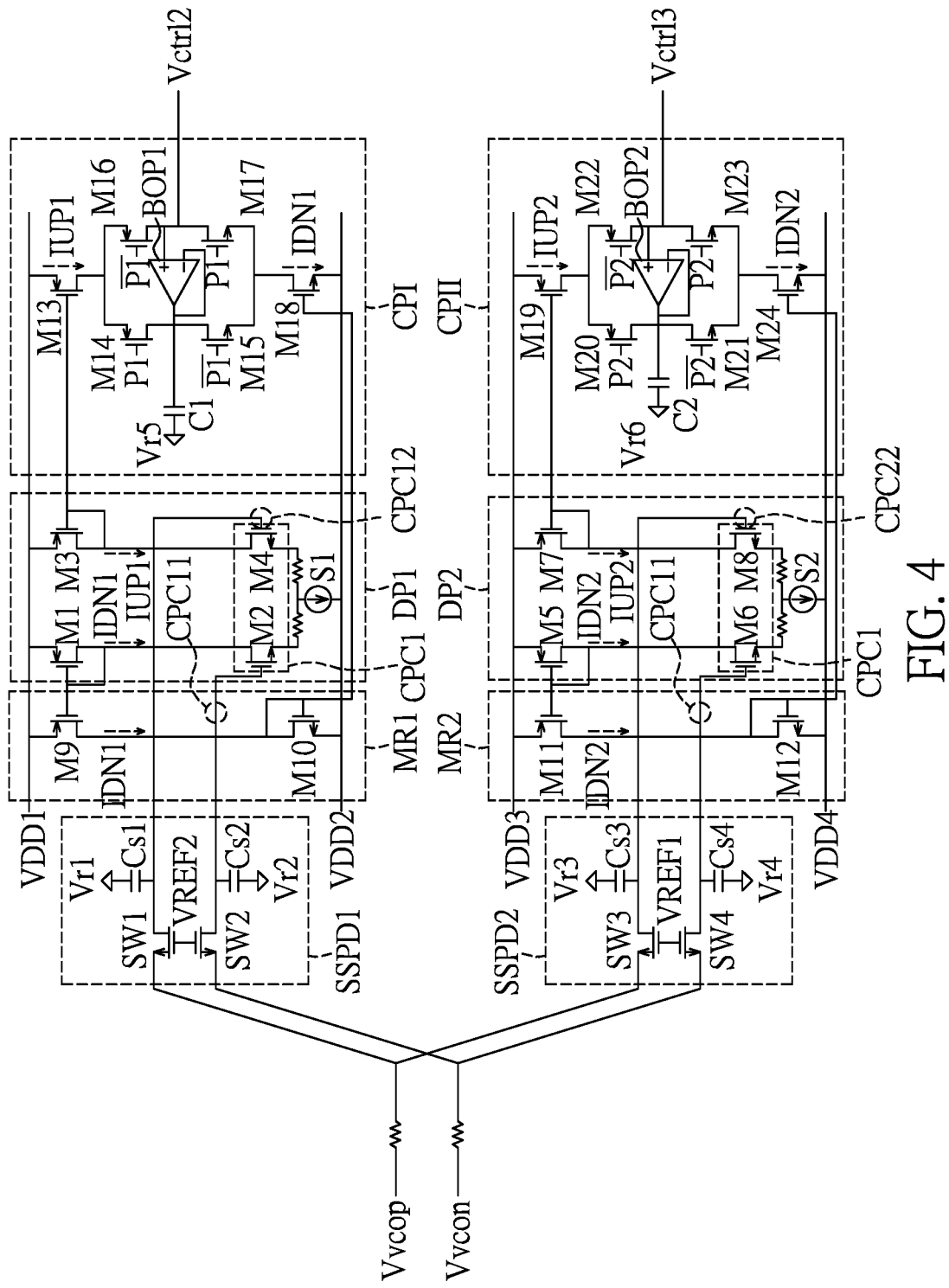
FIG. 4 is a circuit diagram of a first sub-sampling phase detector, a first charge pump circuit, a second sub-sampling phase detector, and a second charge pump circuit in detail according to an embodiment of the present disclosure.

Reference is made to FIGS. 3 and 4, which are a circuit diagram and a detailed circuit diagram of a first sub-sampling phase detector, a first charge pump circuit, a second sub-sampling phase detector, and a second charge pump circuit according to an embodiment of the present disclosure. As shown in FIGS. 3 and 4, the first charge pump circuit CP1 includes a first differential pair circuit DP1, a first current mirror circuit MR1 and a first charge pump CPI, and the second charge pump circuit CP2 includes a second differential pair circuit DP2, a second current mirror circuit MR2 and a second charge pump CPII.

It should be noted that the first sub-sampling phase detector SSPD1 and the second sub-sampling phase detector SSPD2 have a symmetric circuit structure, and the first charge pump circuit CP1 and the second charge pump circuit CP2 have a symmetric circuit structure, so that the first sub-sampling phase detector SSPD1 and the second sub-sampling phase detector SSPD2 have same loads when a first output clock Vvcop and a second output clock Vvcon of the output clock differential pair Vvco are respectively sampled by the first sub-sampling phase detector SSPD1 and the second sub-sampling phase detector SSPD2.

With further reference to FIG. 4, the first sub-sampling phase detector SSPD1 includes a first sampling switch SW1, a second sampling switch SW2, a first sampling capacitor Cs1, and a second sampling capacitor Cs2. The first sampling switch SW1 has one end for receiving the first output clock Vvcop of the output clock differential pair Vvco, and a control end controlled by the second reference clock VREF2 to sample the first output clock Vvcop to output a first charge pump control signal CPC11 of the first charge pump control signal pair CPC1 from another end of the first sampling switch SW1.

The second sampling switch SW2 has one end for receiving the second output clock Vvcon of the output clock differential pair Vvco, and a control end controlled by the second reference clock VREF2 to sample the second output clock Vvcon to output a second charge pump control signal CPC12 of the first charge pump control signal pair CPC1 from another end of the second sampling switch SW2. During operation, the first sub-sampling phase detector SSPD1 directly samples the output clock differential pair Vvco having high frequency with the second reference clock VREF2 having low frequency without using a frequency divider. The first sub-sampling phase detector SSPD1 detects phase differences between the output clock differential pair Vvco and the second reference clock VREF2, and the second reference clock VREF2 samples edges of the output clock differential pair Vvco and convert it into a sampled voltage difference, so as to generate a current for controlling the first charge pump CPI.

The first sampling capacitor Cs1 is connected between the another end of the first sampling switch SW1 and a first reference voltage source Vr1. The second sampling capacitor Cs2 is connected between the another end of the second sampling switch SW2 and a second reference voltage source Vr2.

With further reference to FIG. 3, the first differential pair circuit DP1 is configured to convert the first charge pump control signal CPC11 and the second charge pump control signal CPC12 into a first charge pump control current IUP1 and a second charge pump control current IDN1, and the first current mirror circuit MR1 is configured to replicate the first charge pump control current IUP1 and the second charge pump control current IDN1 to be input to the first charge pump CPI.

In detail, the first differential pair circuit DP1 may include a first transistor M1, a second transistor M2, a third transistor M3, a fourth transistor M4, and a first current source S1. A first end of the first transistor M1 is connected to a first system reference voltage VDD1, a second end of the first transistor M1 is connected to a third end of the first transistor M1, a first end of the second transistor M2 is connected to the third end of the first transistor M1, and a second end of the second transistor M2 receives the first charge pump control signal CPC11, and a third end of the second transistor M2 is connected to a second system reference voltage VDD2 through the first current source S1. A first end of the third transistor M3 is connected to the first system reference voltage VDD1, and a second end of the third transistor M3 is connected to a third end of the third transistor M3. The fourth transistor having a first end connected to the third end of the third transistor M3, a second end receiving the second charge pump control signal CPC12, and a third end connected to the second system reference voltage VDD2 through the first current source S1.

Therefore, in response to the first charge pump control signal CPC11 and the second charge pump control signal CPC12, and based on the current magnitude of the first current source S1, the first charge pump control current IDN1 is generated at the first transistor M1, and the second charge pump control current IUP1 is generated at the third transistor M3.

Further, the first current mirror circuit MR1 includes a ninth transistor M9 and a tenth transistor M10. A first end of the ninth transistor M9 is connected to the first system reference voltage VDD1, and a second end of the ninth transistor M9 is connected to the second end of the first transistor M1. The tenth transistor M10 has a first end connected to a second end of the tenth transistor M10 and a third end of the ninth transistor M9, and a third end connected to the second system reference voltage VDD2.

Here, the ninth transistor M9 forms a current mirror structure with the first transistor M1, such that the second charge pump control current IDN1 is generated at the ninth transistor M9.

With further reference to FIG. 4, the first charge pump CPI can include a thirteenth transistor M13, a fourteenth transistor M14, a fifteenth transistor M15, a sixteenth transistor M16, a seventeenth transistor M17, and a eighteenth transistor M18. The thirteenth transistor M13 has a first end connected to the first system reference voltage VDD1 and a second end connected to the second end of the third transistor M3. Here, the thirteenth transistor M13 and the third transistor M3 form a current mirror structure, such that the first charge pump control current IUP1 is generated at the thirteenth transistor M13.

The fourteenth transistor M14 has a first end connected to the third end of the thirteenth transistor M13, a second end receiving the first pulse signal P1, and a third end connected to a fifth system reference voltage Vr5 through a first capacitor C1. The fifteenth transistor M15 has a first end connected to the third end of the fourteenth transistor M14 and a second end receiving a first pulse inversion signal P1. The sixteenth transistor M16 has a first end connected to the third end of the thirteenth transistor M13 and a second end receiving the first pulse inversion signal $\overline{P1}$. The seventeenth transistor M17 has a first end connected to the third end of the sixteenth transistor M1 and a second end receiving the first pulse signal P1.

The eighteenth transistor M18 has a first end connected to the third end of the fifteenth transistor M15 and a third end of the seventeenth transistor M17, a second end connected to the second end of the tenth transistor M10, and a third end connected to the second system reference voltage VDD2. Here, the eighteenth transistor M18 and the tenth transistor M10 form a current mirror architecture, such that the second charge pump control current IDN1 is generated at the eighteenth transistor M18.

In addition, the first charge pump CPI further includes a first buffer amplifier BOP1 having a first input end connected to the second end of the sixteenth transistor M16, a second input end connected to a third end of the first buffer amplifier BOP1, and the third end is connected to the third end of the fifteenth transistor M15. The first buffer amplifier BOP1 can be used to reduce an issue of charge sharing in the first charge pump CPI, in which the first buffer amplifier BOP1 can be a single gain amplifier (OPA) as a buffer, when transistors in the first charge pump CPI are turned off, since the current source is composed of transistors, a drain voltage thereof can be maintained at a level as the same as the voltage level of the output by following low pass filter, and when the other transistors are turned on, the charge sharing effect can be reduced.

Figure 5:
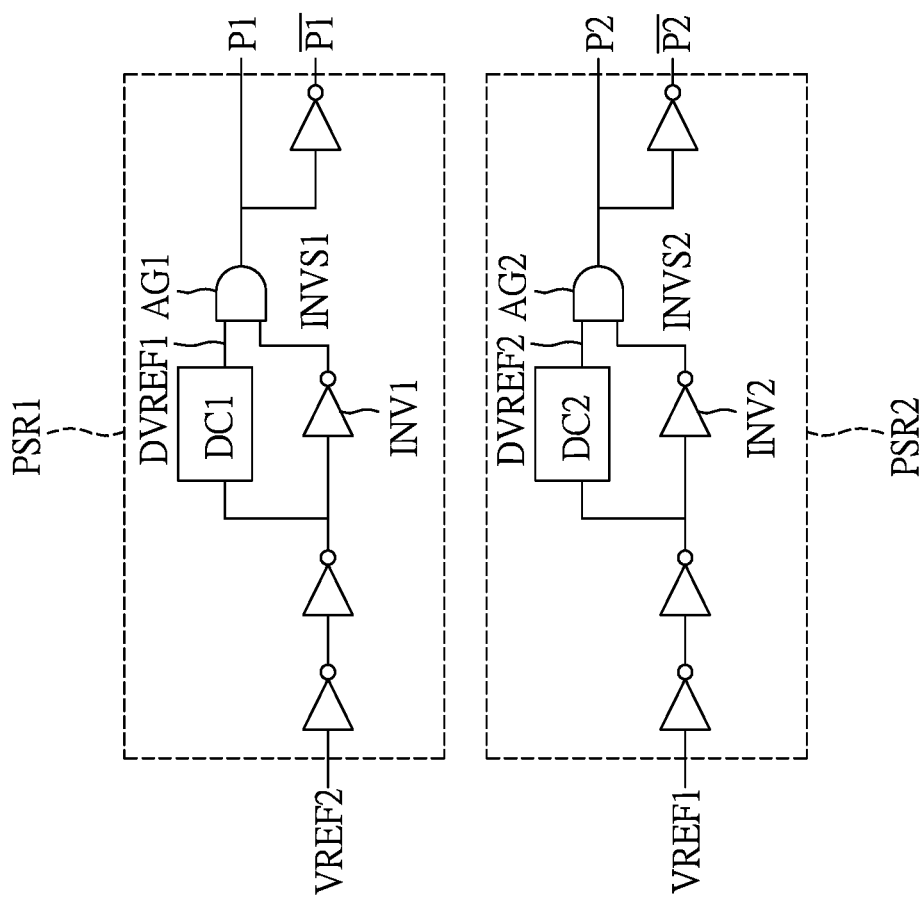
FIG. 5 is a circuit diagram of a first pulse generator and a second pulse generator according to an embodiment of the present disclosure.

Furthermore, referring to FIG. 5, which is a circuit diagram of a first pulse generator and a second pulse generator according to an embodiment of the present disclosure, in detail, the SSPLL as shown in FIG. 5 further includes a first pulse generator PSR1 including a first delay unit DC1, a first inverter INV1, and a first AND gate AG1. The first delay unit DC1 is configured to delay the second reference clock VREF2 by a first pulse delay time τp1 to generate a first delay reference clock DVREF1. The first inverter INV1 is configured to invert the second reference clock VREF2 to generate a first inversion signal INVS1. The first AND gate AG1 performs an AND operation on the first delayed reference clock DVREF1 and the first inversion signal INVS1 to generate the first pulse signal P1, and generates the first pulse inversion signal $\overline{P1}$ through another inverter. The first pulse signal P1 does not overlap with the second reference clock VREF2.

In detail, the fourteenth transistor M14, the fifteenth transistor M15, the sixteenth transistor M16, and the seventeenth transistor M17 are respectively controlled by the first pulse signal P1 and the first pulse inversion signal $\overline{P1}$ provided by the first pulse generator PSR1 to provide a second control signal Vctrl2 having the same period as the second reference clock VREF2 and having the same first pulse delay time tip 1 as the first pulse signal P1, so that the first charge pump CPI initiates the first pulse delay time τp1 merely in single cycle of the second reference clock VREF2, and a gain of the first charge pump CPI is dependent on the first pulse delay time τp1. Therefore, when phase errors between the output clock differential pair Vvco and the second reference clock edge of VREF2 is zero, ripples can be prevented from appearing in the output second control signal Vctrl2.

Similarly, the first sub-sampling phase detector SSPD1 and the second sub-sampling phase detector SSPD2 have a symmetric circuit architecture, and the first charge pump circuit CP1 and the second charge pump circuit CP2 have a symmetric circuit architecture. Referring to FIGS. 3 and 4, the second sub-sampling phase detector SSPD2 includes a third sampling switch SW3, a fourth sampling switch SW4, a third sampling capacitor Cs3, and a fourth sampling capacitor Cs4. The third sampling switch SW3 has one end for receiving the first output clock Vvcop of the output clock differential pair Vvco, and a control end controlled by the first reference clock VREF1 to sample the first output clock Vvcop to output a third charge pump control signal CPC22 of the second charge pump control signal pair CPC2 from another end of the third sampling switch SW3.

The fourth sampling switch SW4 has one end receiving the second output clock Vvcon of the output clock differential pair Vvco, and a control end controlled by the second reference clock VREF2 to sample the second output clock to output a fourth charge pump control signal CPC21 of the second charge pump control signal pair CPC2 from another end of the fourth sampling switch SW4. During operation, the second sub-sampling phase detector SSPD2 directly samples the output clock differential pair Vvco having high frequency with the first reference clock VREF1 having low frequency without using a frequency divider. The second sub-sampling phase detector SSPD2 detects phase differences between the output clock differential pair Vvco and the first reference clock VREF1, and the first reference clock VREF1 samples edges of the output clock differential pair Vvco and converts it into a sampled voltage difference, so as to generate a current for controlling the second charge pump CPII.

The third sampling capacitor Cs3 is connected between the another end of the third sampling switch SW3 and the third reference voltage source Vr3. The fourth sampling capacitor Cs4 is connected between the another end of the fourth sampling switch SW4 and the fourth reference voltage source Vr4.

With further reference to FIG. 3, the second differential pair circuit DP2 is configured to convert the third charge pump control signal CPC21 and the fourth charge pump control signal CPC22 into a third charge pump control current IUP2 and a fourth charge pump control current IDN2, and the second current mirror circuit MR2 is configured to replicate the third charge pump control current IUP2 and the fourth charge pump control current IDN2 to be input to the second charge pump CPII.

In detail, the second differential pair circuit DP2 may include a fifth transistor M5, a sixth transistor M6, a seventh transistor M7, an eighth transistor M8, and a second current source S2. The fifth transistor M5 has a first end connected to a third system reference voltage VDD3 and a second end connected to a third end of the fifth transistor M5. The sixth transistor M6 has a first end connected to the third end of the fifth transistor M5, a second end receiving the third charge pump control signal CPC21, and a third end connected to a fourth system reference voltage VDD4 through the second current source S2. The seventh transistor M7 has a first end connected to the third system reference voltage VDD3 and a second end connected to a third end of the seventh transistor M7. The eighth transistor M8 has a first end connected to the third end of the seventh transistor M7, a second end receiving the fourth charge pump control signal CPC22, and a third end connected to the fourth system reference voltage VDD4 through the second current source S2.

Therefore, in response to the third charge pump control signal CPC21 and the fourth charge pump control signal CPC22, and based on a current magnitude of the second current source S2, the third charge pump control current IUP2 is generated at the fifth transistor M5, and the fourth charge pump control current IDN2 is generated at the seventh transistor M7.

Further, the second current mirror circuit MR2 includes an eleventh transistor M11 and a twelfth transistor M12. A first end of the eleventh transistor M11 is connected to the third system reference voltage VDD3, and a second end of the eleventh transistor M11 is connected to the second end of the fifth transistor M5. The twelfth transistor M12 has a first end connected to a second end of the twelfth transistor M12 and a third end of the eleventh transistor M11, and a third end connected to the fourth system reference voltage VDD4.

Here, the eleventh transistor M11 and the fifth transistor M5 form a current mirror structure, such that the fourth charge pump control current IDN2 is generated at the eleventh transistor M11.

With further reference to FIG. 4, the second charge pump CPII may include a nineteenth transistor M19, a twentieth transistor M20, a twenty-first transistor M21, a twenty-second transistor M22, a twenty-third transistor M23, and a twenty-fourth transistor M24. The nineteenth transistor M19 has a first end connected to the third system reference voltage VDD3 and a second end connected to the second end of the seventh transistor M7. Here, the nineteenth transistor M19 and the seventh transistor M7 form a current mirror structure, such that the third charge pump control current IUP2 is generated at the nineteenth transistor M19.

The twentieth transistor M20 has a first end connected to the third end of the nineteenth transistor M19, a second end receiving the second pulse signal P2, and a third end connected to a sixth system reference voltage Vr6 through a second capacitor C1. The twenty-first transistor M21 has a first end connected to the third end of the twentieth transistor M20 and a second end receiving a second pulse inversion signal $\overline{P2}$. The twenty-second transistor M22 has a first end connected to the third end of the nineteenth transistor M19 and a second end receiving the second pulse inversion signal $\overline{P2}$. The twenty-third transistor M23 has a first end connected to a third end of the twenty-second transistor M22 and a second end receiving the second pulse signal P2.

The twenty-fourth transistor M24 has a first end connected to a third end of the twenty-first transistor M21 and a third end of the twenty-third transistor M23, a second end connected to the second end of the twelfth transistor M12, and a third end connected to the fourth system reference voltage VDD4. Here, the twenty-fourth transistor M24 and the twelfth transistor M12 form a current mirror structure, such that the fourth charge pump control current IDN2 is generated at the twenty-fourth transistor M24.

In addition, the second charge pump CPII further includes a second buffer amplifier BOP2 having a first input end connected to the second end of the twenty-second transistor M22 and a second input end connected to a third end of the second buffer amplifier BOP2, and the third end of the second buffer amplifier BOP2 is connected to the third end of the first transistor M21. The second buffer amplifier BOP2 can be used to reduce an issue of charge sharing in the second charge pump CPII, in which the second buffer amplifier BOP2 can be a single gain amplifier (OPA) as a buffer, when transistors in the second charge pump CPII are turned off, since the current source is composed of transistors, a drain voltage thereof can be maintained at a level that is the same as the voltage level of the output by following low pass filter, and when the other transistors are turned on, the charge sharing effect can be reduced.

Furthermore, referring to FIG. 5, the sub-sampling phase-locked loop SSPLL further includes a second pulse generator PSR2 including a second delay unit DC2, a second inverter INV2, and a second AND gate AG2. The second delay unit DC2 is configured to delay the first reference clock VREF1 by a second pulse delay time $\tau p2$ to generate a second delay reference clock DVREF2. The second inverter INV2 is configured to invert the second reference clock VREF1 to generate a second inversion signal INVS2. The second AND gate AG2 performs an AND operation on the second delayed reference clock DVREF2 and the second inversion signal INVS2 to generate the second pulse signal P2, and generates the second pulse inversion signal P2 after the second pulse signal P2 passing through another inverter. The second pulse signal P2 does not overlap with the first reference clock VREF1.

In detail, the twentieth transistor M20, the twenty-first transistor M21, the twenty-second transistor M22, and the twenty-third transistor M23 are respectively controlled by the second pulse signal P2 and the second pulse inversion signal $\overline{P2}$ provided by the second pulse generator PSR2 to provide the third control signal Vctrl3 having the same period as the first reference clock VREF1 and having the same second pulse delay time $\tau p2$ as the second pulse signal P2, such that the second charge pump CPII initiates the second pulse delay time $\tau p2$ merely in a single cycle of the first reference clock VREF1, and a gain of the second charge pump CPII is dependent on the second pulse delay time $\tau p2$. Therefore, when phase errors between the output clock differential pair Vvco and the first reference clock VREF1 is zero, ripples can be prevented from appearing in the output third control signal Vctrl3.

Figure 6:
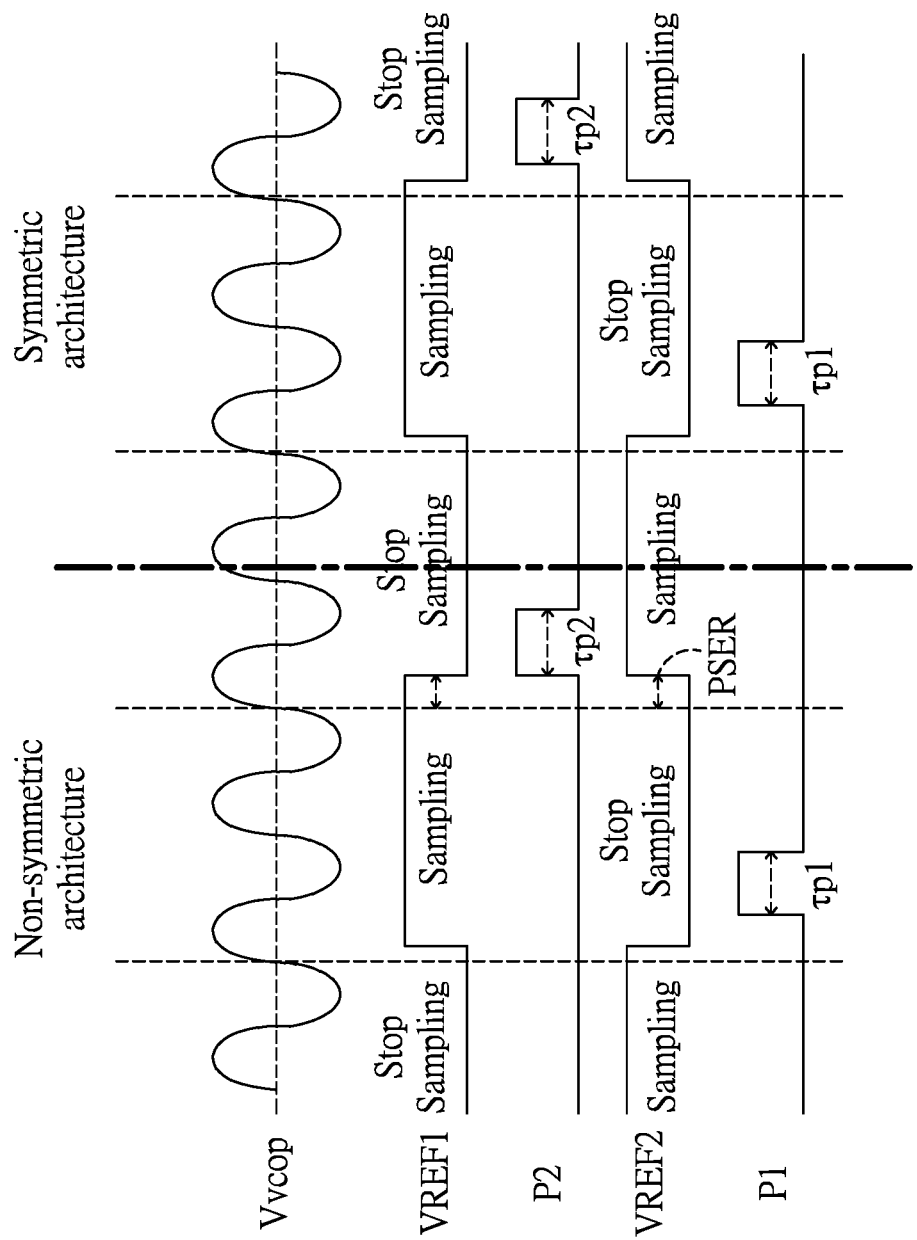
FIG. 6 is a timing diagram of signals using a symmetric architecture and a non-symmetric architecture according to an embodiment of the present disclosure.

Reference is made to FIG. 6, which is a timing diagram of signals using a symmetric architecture and a non-symmetric architecture, in accordance with an embodiment of the present disclosure. As shown in FIG. 6, in a case where the symmetry architecture is not used, since the two sampling circuits having different loads relative to the first output clock Vvcop while the two sampling circuits (such as the first sub-sampling phase detector SSPD1 and the second sub-sampling phase detector SSPD2 described above) are sampling, a phase error PSER may appear in a sampling position. On the other hand, in a case where the symmetrical architecture is used, since the first sub-sampling phase detector SSPD1 and the second sub-sampling phase detector SSPD2 has a completely symmetrical circuit structure while the two sampling phase detectors are sampling, so that the output clock differential pair Vvco is provided with same waveforms to achieve accurate sampling and elimination of the phase error PSER.

Advantageous Effects of Embodiments

Therefore, the phase-locked loop circuit provided by the present disclosure utilizes two sub-sampling phase detectors with a symmetric circuit architecture and a charge pump to achieve symmetric sampling, so that the waveform of the output clock differential pair will not be affected when a sub-sampling phase detection technology is applied in the phase-locked loop circuit, and thus accurate sampling can be achieved to improve the performance of the phase-locked loop circuit.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A phase-locked loop circuit comprising:
 a delay phase-locked loop configured to lock a first reference clock and a second reference clock to an input clock, including:
 a phase correction circuit configured to adjust the input clock according to a first control signal or a second control signal, and generate the first reference clock and the second reference clock;
 an integrator configured to generate the first control signal according to the first reference clock and the second reference clock;
 a first sub-sampling phase detector configured to sample an output clock differential pair with the second reference clock, and convert a phase error between the second reference clock and the output clock differential pair to output a first charge pump control signal pair;
 a first charge pump circuit configured to generate the second control signal according to the first charge pump control signal pair; and
 a sub-sampling phase-locked loop configured to generate the output clock differential pair with a predetermined phase-locked loop frequency, wherein the output clock differential pair is phase-locked to the first reference clock, wherein the sub-sampling phase-locked loop includes:
 a second sub-sampling phase detector configured to sample the output clock differential pair with the first reference clock and convert phase errors between the first reference clock and the output clock differential pair to output a second charge pump control signal pair;
 a second charge pump circuit configured to generate a third control signal according to the second charge pump control signal pair;
 a phase frequency detecting circuit configured to receive the first reference clock and a frequency-dividing signal, wherein when a phase error between the first reference clock and the frequency-dividing signal is greater than a predetermined dead time, the phase detecting circuit generates a fourth control signal;
 a voltage controlled oscillator configured to generate the output clock differential pair based on the third control signal and the fourth control signal; and a first frequency divider configured to frequency divide the output clock differential pair to generate the frequency-dividing signal, wherein the first sub-sampling phase detector and the second sub-sampling phase detector have a symmetric circuit structure, and the first charge pump circuit and the second charge pump circuit have a symmetric circuit structure, so that the first sub-sampling phase detector and the second sub-sampling phase detector have same loads when the output clock differential pair is respectively sampled by the first sub-sampling phase detector and the second sub-sampling phase detector.

2. The phase-locked loop circuit according to claim 1, wherein the second reference clock system is an inversion signal of the first reference clock.

3. The phase-locked loop circuit according to claim 1, wherein the first sub-sampling phase detector includes:
a first sampling switch having one end for receiving a first output clock of the output clock differential pair, and a control end controlled by the second reference clock to sample the first output clock to output a first charge pump control signal of the first charge pump control signal pair from another end of the first sampling switch; and
a second sampling switch having one end for receiving a second output clock of the output clock differential pair, and a control end controlled by the second reference clock to sample the second output clock to output a second charge pump control signal of the first charge pump control signal pair from another end of the second sampling switch.

4. The phase-locked loop circuit according to claim 3, wherein the second sub-sampling phase detector includes:
a third sampling switch having one end for receiving the first output clock of the output clock differential pair, and a control end controlled by the first reference clock to sample the second output clock to output a third charge pump control signal of the second charge pump control signal pair from another end of the third sampling switch; and
a fourth sampling switch having one end for receiving the second output clock of the output clock differential pair, and a control end controlled by the second reference clock to sample the second output clock to output a fourth charge pump control signal of the second charge pump control signal pair from another end of the fourth sampling switch.

5. The phase-locked loop circuit according to claim 4, wherein the first sub-sampling phase detector includes:
a first sampling capacitor connected between the another end of the first sampling switch and a first reference voltage source; and
a second sampling capacitor connected between the another end of the second sampling switch and a second reference voltage source.

6. The phase-locked loop circuit according to claim 5, wherein the second sub-sampling phase detector includes:
a third sampling capacitor connected between the another end of the third sampling switch and a third reference voltage source; and
a fourth sampling capacitor connected between the another end of the fourth sampling switch and a fourth reference voltage source.

7. The phase-locked loop circuit according to claim 6, wherein the first charge pump circuit includes:
a first differential pair circuit configured to convert the first charge pump control signal and the second charge pump control signal into a first charge pump control current and a second charge pump control current; and
a first charge pump configured to convert a difference between the first charge pump control current and the second charge pump control current into the second control signal according to a first pulse control signal and output the second control signal.

8. The phase-locked loop circuit according to claim 7, wherein the second charge pump circuit includes:
a second differential pair circuit configured to convert the third charge pump control signal and the fourth charge pump control signal into a third charge pump control current and a fourth charge pump control current; and
a second charge pump configured to convert a difference between the third charge pump control current and the fourth charge pump control current into the third control signal according to a second pulse control signal and output the third control signal.

9. The phase-locked loop circuit according to claim 8, wherein the first charge pump circuit further includes a first current mirror circuit configured to replicate the first charge pump control current and the second charge pump control current to be input to the first charge pump.

10. The phase-locked loop circuit according to claim 9, wherein the second charge pump circuit further includes a second current mirror circuit configured to replicate the third charge pump control current and the fourth charge pump control current to be input to the second charge pump.

11. The phase-locked loop circuit according to claim 10, wherein the first differential pair circuit includes:
a first transistor having a first end connected to a first system reference voltage and a second end connected to a third end of the first transistor;
a second transistor having a first end connected to the third end of the first transistor, a second end receiving the first charge pump control signal, and a third end connected to a second system reference voltage through a first current source;
a third transistor having a first end connected to the first system reference voltage and a second end connected to the third end of the third transistor; and
a fourth transistor having a first end connected to the third end of the third transistor, a second end receiving the second charge pump control signal, and a third end connected to the second system reference voltage through the first current source.

12. The phase-locked loop circuit according to claim 11, wherein the second differential pair circuit includes:
a fifth transistor having a first end connected to a third system reference voltage and a second end connected to a third end of the fifth transistor;
a sixth transistor having a first end connected to the third end of the fifth transistor, a second end receiving the third charge pump control signal, and a third end connected to a fourth system reference voltage through a second current source;
a seventh transistor having a first end connected to the third system reference voltage and a second end connected to a third end of the seventh transistor; and
an eighth transistor having a first end connected to the third end of the seventh transistor, a second end receiving the fourth charge pump control signal, and a third end connected to the fourth system reference voltage through the second current source.

13. The phase-locked loop circuit according to claim 12, wherein the first current mirror circuit includes:

a ninth transistor having a first end connected to the first system reference voltage and a second end connected to the second end of the first transistor; and a tenth transistor having a first end connected to a second end of the tenth transistor and a third end of the ninth transistor, and a third end connected to the second system reference voltage.

14. The phase-locked loop circuit according to claim 13, wherein the second current mirror circuit includes:

an eleventh transistor having a first end connected to the third system reference voltage and a second end connected to the second end of the fifth transistor; and a twelfth transistor having a first end connected to a second end of the twelfth transistor and a third end of the eleventh transistor, and a third end connected to the fourth system reference voltage.

15. The phase-locked loop circuit according to claim 14, wherein the first charge pump includes:

a thirteenth transistor having a first end connected to the first system reference voltage and a second end connected to the second end of the third transistor;

a fourteenth transistor having a first end connected to the third end of the thirteenth transistor, a second end receiving a first pulse signal, and a third end connected to a fifth system reference voltage through a first capacitor;

a fifteenth transistor having a first end connected to the third end of the fourteenth transistor and a second end receiving a first pulse inversion signal;

a sixteenth transistor having a first end connected to a third end of the thirteenth transistor and a second end receiving the first pulse inversion signal;

a seventeenth transistor having a first end connected to the third end of the sixteenth transistor and a second end receiving the first pulse signal; and an eighteenth transistor having a first end connected to the third end of the fourteenth transistor and a third end of the seventeenth transistor, a second end connected to the second end of the tenth transistor, and a third end connected to the second system reference voltage.

16. The phase-locked loop circuit according to claim 15, wherein the second charge pump includes:

a nineteenth transistor having a first end connected to the third system reference voltage and a second end connected to the second end of the seventh transistor;

a twentieth transistor having a first end connected to a third end of the nineteenth transistor, a second end receiving a second pulse signal, and a third end connected to a sixth system reference voltage through a second capacitor;

a twenty-first transistor having a first end connected to the third end of the twentieth transistor and a second end receiving a second pulse inversion signal;

a twenty-second transistor having a first end connected to the third end of the nineteenth transistor and a second end receiving the second pulse inversion signal;

a twenty-third transistor having a first end connected to a third end of the twenty-second transistor and a second end receiving the second pulse signal; and a twenty-fourth transistor having a first end connected to a third end of the twenty-first transistor and a third end of the twenty-third transistor, a second end connected to the second end of the twelfth transistor, and a third end connected to the fourth system reference voltage.

17. The phase-locked loop circuit according to claim 16, wherein the first charge pump further includes a first buffer amplifier having a first input end connected to the second end of the sixteenth transistor, a second input end connected to a third end of the first buffer amplifier, and the third end of the first buffer amplifier connected to a third end of the fifteenth transistor.

18. The phase-locked loop circuit according to claim 17, wherein the second charge pump further includes a second buffer amplifier having a first input end connected to the second end of the twenty-second transistor, a second input end connected to a third end of the second buffer amplifier, and a third end of the second buffer amplifier connected to the third end of the twentieth transistor.

19. The phase-locked loop circuit according to claim 18, wherein the delay phase-locked loop further includes a first pulse generator, including:

a first delay unit configured to delay the second reference clock by a first pulse delay time to generate a first delayed reference clock;

a first inverter configured to invert the second reference clock to generate a first inversion signal; and a first AND gate performs an AND operation on the first delayed reference clock and the first inversion signal to generate the first pulse signal, wherein the first pulse signal does not overlap with the second reference clock.

20. The phase-locked loop circuit according to claim 19, wherein the sub-sampling phase-locked loop further includes a second pulse generator, including:

a second delay unit configured to delay the first reference clock by a second pulse delay time to generate a second delay reference clock;

a second inverter configured to invert the first reference clock to generate a second inversion signal; and a second AND gate configured to perform an AND operation on the second delayed reference clock and the second inversion signal to generate the second pulse signal, wherein the second pulse signal does not overlap with the first reference clock.

* * * * *